(12) United States Patent
Ku

(10) Patent No.: US 8,513,132 B2
(45) Date of Patent: Aug. 20, 2013

(54) METHOD FOR FABRICATING METAL PATTERN IN SEMICONDUCTOR DEVICE

(75) Inventor: Mi-Na Ku, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 13/324,419

(22) Filed: Dec. 13, 2011

(65) Prior Publication Data

US 2012/0270395 A1 Oct. 25, 2012

(30) Foreign Application Priority Data

Apr. 25, 2011 (KR) .................. 10-2011-0038473

(51) Int. Cl.
- *H01L 21/311* (2006.01)
- *H01L 21/461* (2006.01)
- *H01L 21/31* (2006.01)
- *H01L 21/00* (2006.01)

(52) U.S. Cl.
USPC ..... 438/696; 438/689; 438/761; 257/E21.023

(58) Field of Classification Search
USPC .......................................... 438/689–704, 758
See application file for complete search history.

(56) References Cited

U.S. PATENT DOCUMENTS

| | | | | |
|---|---|---|---|---|
| 6,136,211 A * | 10/2000 | Qian et al. | ........................ | 216/37 |
| 6,228,712 B1 * | 5/2001 | Kawai et al. | ................. | 438/257 |
| 7,052,990 B2 * | 5/2006 | Kim | .............................. | 438/637 |
| 7,126,198 B2 * | 10/2006 | Steiner et al. | ................. | 257/412 |
| 7,550,384 B2 * | 6/2009 | Ban et al. | ....................... | 438/671 |
| 7,582,529 B2 * | 9/2009 | Matamis et al. | ............... | 438/258 |
| 7,615,447 B2 * | 11/2009 | Purayath et al. | ............... | 438/257 |
| 7,807,529 B2 * | 10/2010 | Purayath et al. | ............... | 438/257 |
| 8,039,347 B2 * | 10/2011 | Shin et al. | ...................... | 438/270 |
| 8,119,509 B2 * | 2/2012 | Cho | ............................. | 438/585 |
| 2005/0048785 A1 | 3/2005 | Kang et al. | | |
| 2006/0046382 A1 * | 3/2006 | Yoon et al. | ..................... | 438/254 |
| 2006/0084243 A1 * | 4/2006 | Zhang et al. | ................... | 438/478 |
| 2011/0020992 A1 * | 1/2011 | Purayath et al. | ............... | 438/259 |
| 2011/0104898 A1 * | 5/2011 | Lee | ................................ | 438/689 |
| 2011/0236836 A1 * | 9/2011 | Park et al. | ...................... | 430/323 |
| 2011/0309430 A1 * | 12/2011 | Purayath et al. | ............... | 257/321 |

FOREIGN PATENT DOCUMENTS

| | | | |
|---|---|---|---|
| KR | 10-2006-0106 | * | 10/2006 |
| KR | 1020100008173 | | 1/2010 |
| KR | 1020110003033 | | 1/2011 |

OTHER PUBLICATIONS

Office Action issued by the Korean Intellectual Property Office on Jul. 6, 2012.

\* cited by examiner

*Primary Examiner* — Seahvosh Nikmanesh
*Assistant Examiner* — Evren Seven
(74) *Attorney, Agent, or Firm* — IP & T Group LLP

(57) ABSTRACT

A method for fabricating a metal pattern in a semiconductor device includes forming a metal layer over a substrate, forming a hard mask layer over the metal layer, forming a sacrifice pattern over the hard mask layer, forming a spacer pattern on sidewalks of the sacrifice pattern, removing the sacrifice pattern, forming a hard mask pattern by etching the hard mask layer using the spacer pattern as an etch barrier, forming an etching protection layer over the hard mask pattern and on sidewalks of the hard mask pattern, and forming the metal pattern by performing primary and secondary etching processes on the metal layer using the etching protection layer as an etch barrier.

17 Claims, 6 Drawing Sheets

METHOD FOR FABRICATING METAL PATTERN IN SEMICONDUCTOR DEVICE

CROSS-REFERENCE TO RELATED APPLICATIONS

The present application claims priority of Korean Patent Application No. 10-2011-0038473, filed on Apr. 25, 2011, which is incorporated herein by reference in its entirety.

BACKGROUND

1. Field

Exemplary embodiments of the present invention relate to semiconductor fabrication technology, and more particularly, to a method for fabricating a metal pattern in a semiconductor device.

2. Description of the Related Art

As highly integrated, semiconductor devices have fine patterns. As a result, a photoresist layer used in forming fine patterns has almost reached a limit of its resolution. Accordingly, a fine pattern formation method using a spacer pattern technology (SPT) process has been introduced.

Meanwhile, a metal pattern is applied to increase an operation speed of a device. In particular, when a metal pattern is formed of tungsten, fluorine-based gas is used as tungsten etching gas. In this case, a side surface damage of a hard mask nitride layer over a tungsten layer may occur. Furthermore, if the etching is continuously performed using the damaged hard mask nitride layer, the tungsten layer may be cut in the middle. On the other hand, when polymer-based gas is used in consideration of the side surface damage of the hard mask nitride layer, a less-etching may occur. That is, the tungsten layer is not completely etched, and a pattern is not formed. In order to prevent an occurrence of the less-etching and compensate for a low etching speed when using polymer-based gas, the height of a mask over the hard mask nitride layer may be increased. In this case, when the height of the mask is increased to a certain value or more, lifting may occur due to the nature of the SPT process.

FIG. 1 is a transmission electron microscopy (TEM) photography illustrating the features of the conventional semiconductor device.

Referring to FIG. 1, a tungsten layer was cut due to a side surface damage, and a less-etching occurred. As described above, when a less-etching occurs, a lower layer may be not completely etched, and a desired pattern may be not formed.

SUMMARY

Exemplary embodiments of the present invention are directed to a method for fabricating a metal pattern in a semiconductor device, which is capable of forming fine patterns while preventing a metal pattern from being cut and less-etched.

In accordance with an exemplary embodiment of the present invention, a method for fabricating a metal pattern in a semiconductor device includes forming a metal layer over a substrate, forming a hard mask layer over the metal layer, forming a sacrifice pattern over the hard mask layer, forming a spacer pattern on sidewalls of the sacrifice pattern, removing the sacrifice pattern, forming a hard mask pattern by etching the hard mask layer using the spacer pattern as an etch barrier, forming an etching protection layer over the hard mask pattern and on sidewalls of the hard mask pattern; and forming the metal pattern by performing primary and secondary etching processes on the metal layer using the etching protection layer as an etch barrier.

The hard mask layer may include a stacked structure of a hard mask nitride layer, a carbon layer, a silicon oxynitride layer, and a polysilicon layer. The sacrifice pattern may include a carbon layer. Furthermore, the sacrifice pattern may include a spin on carbon (SOD) layer or amorphous carbon layer.

The removing of the sacrifice pattern may be performed by an oxygen stripping process.

The spacer pattern may be formed of oxide. The spacer pattern may include an ultra low temperature oxide (ULTO).

The etching protection layer may include a ULTO. The ULTO may be formed at a temperature of 75° C. to 100° C. The etching protection layer may be formed to a thickness of 30 Å to 50 Å.

The primary etching process may be performed using a gas mixture of $NF_3$ and $Cl_2$.

The secondary etching process may be performed to etch the metal layer and simultaneously remove the etching protection layer. The secondary etching process may be performed using a gas mixture of $CF_4$ and $Cl_2$.

DETAILED DESCRIPTION

Figure 1:
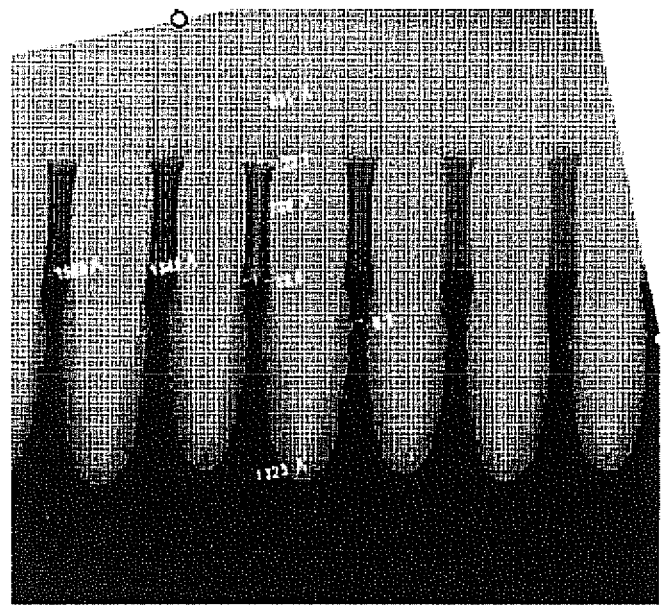
FIG. 1 is a transmission electron microscopy (TEM) photography illustrating the feature of a conventional semiconductor device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

FIGS. 2A to 2I are cross-sectional views illustrating a method for fabricating a metal pattern in a semiconductor device in accordance with an exemplary embodiment of the present invention.

Figure 2A:
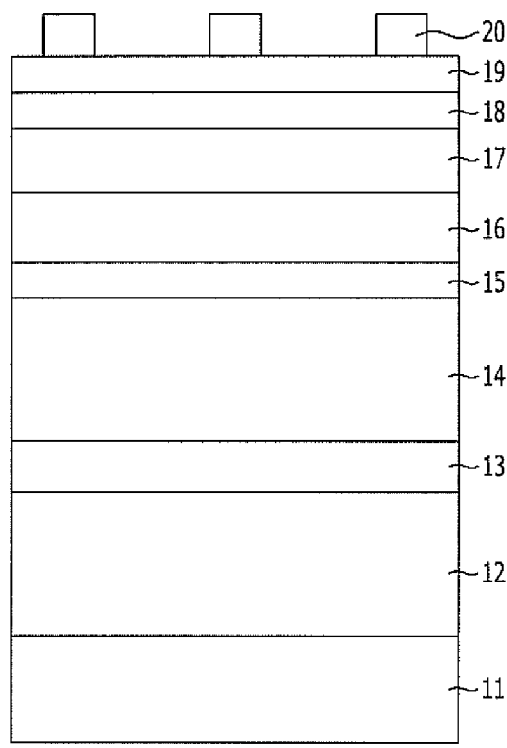
FIGS. 2A to 2I are cross-sectional views illustrating a method for fabricating a metal pattern in a semiconductor device in accordance with an exemplary embodiment of the present invention.

Referring to FIG. 2A, a metal layer 12, a hard mask nitride layer 13, a first carbon layer 14, a first silicon oxynitride layer 15, a polysilicon layer 16, a second carbon layer 17, a second silicon oxynitride layer 18, and a reflection prevention layer 19 are stacked over a substrate 11.

The substrate 11 includes a substrate subjected to a series of fabrication processes for forming a gate pattern, a landing plug contact and so on.

The metal layer 12 which is to be used as a metal electrode is formed of tungsten (W), for example. The hard mask nitride layer 13 serves as an etch barrier when etching the metal layer 12. When the metal layer 12 is formed of W, the hard mask nitride layer 13 serves as an oxidation prevention layer for preventing the oxidation of W.

The first carbon layer 14 serves as an etch barrier of the hard mask nitride layer 13. The first carbon layer 14 includes amorphous carbon, and it is formed at a temperature of 500° C. or more, in order to prevent lifting from occurring due to a high temperature when the subsequent polysilicon layer 16 is formed.

The second carbon layer 17 serves as a sacrifice pattern for forming a subsequent spacer pattern, and it includes a spin on carbon (SOC) layer or an amorphous carbon layer. When the second carbon layer 17 is formed of an amorphous carbon layer, the second carbon layer 17 may be formed at a lower temperature than the first carbon layer 14 without taking the lifting into consideration.

A photoresist pattern 20 is formed over the reflection prevention layer 19. The photoresist pattern 20 is provided to define a sacrifice pattern region for forming a spacer pattern, and it is formed in a line type. The critical dimension (CD) of the photoresist pattern 20 is controlled in consideration of the formation of the spacer pattern. Desirably, the CD is controlled in such a manner that a ratio of line to space is set to 1:3.

Figure 2B:
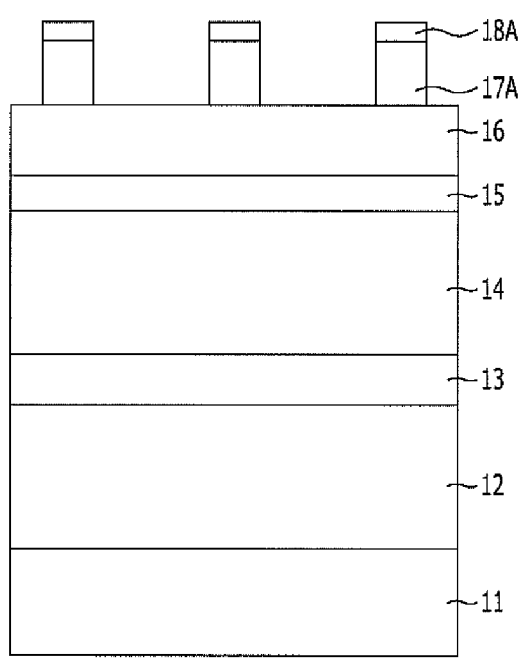

Referring to FIG. 2B, the reflection prevention layer 19 and the second silicon oxynitride layer 18 are etched using the photoresist pattern 20 as an etch barrier.

Furthermore, the second carbon layer 17 is etched to form a sacrifice pattern 17A. At a time point when the formation of the sacrifice pattern 17A is completed, the photoresist pattern 20 and the reflection prevention layer 19 are completely removed, and only a second silicon oxynitride pattern 18A remains.

Figure 2C:
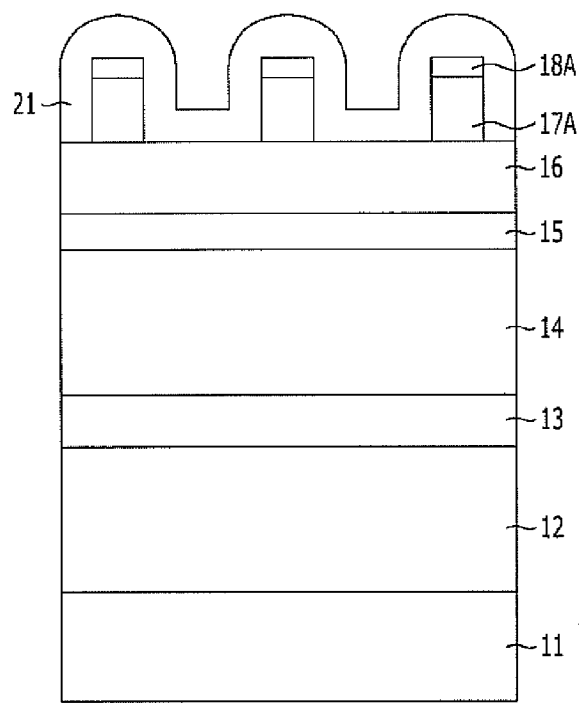

Referring to FIG. 2C, a spacer layer 21 is formed along the surface of the entire structure including the sacrifice pattern 17A. The spacer layer 21 is formed of a material having an etching selectivity with respect to the sacrifice pattern 17A and the polysilicon layer 16.

The spacer layer 21 may be formed of oxide, and the oxide may include ultra low temperature oxide (ULTO), for example. The ULTO is formed at a temperature of 75° to 100° C., and it has an excellent step coverage and thickness uniformity. Therefore, the spacer layer 21 may be formed with a uniform thickness along the surface of the entire structure (even in the stepped portions thereof), without the occurrence of overhang or the like.

Figure 2D:
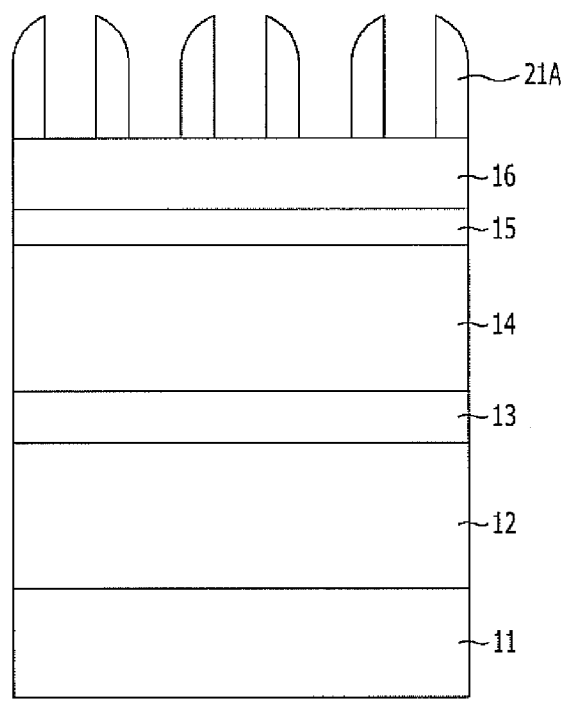

Referring to FIG. 2D, the spacer layer 21 is etched to form a spacer pattern 21A on sidewalls of the sacrifice pattern 17A. When the spacer pattern 21A is formed, the etching is aimed to remove the second silicon oxynitride pattern 18A such that the sacrifice pattern 17A is exposed.

The sacrifice pattern 17A between the spacer patterns 21A is removed. The sacrifice pattern 17A may be removed by dry etching. When the sacrifice pattern 17A is formed of a carbon layer (for example, SOC layer or amorphous carbon layer), the sacrifice pattern 17A is removed by an oxygen stripping process.

Accordingly, only the spacer pattern 21A remains over the polysilicon layer 16.

Figure 2E:
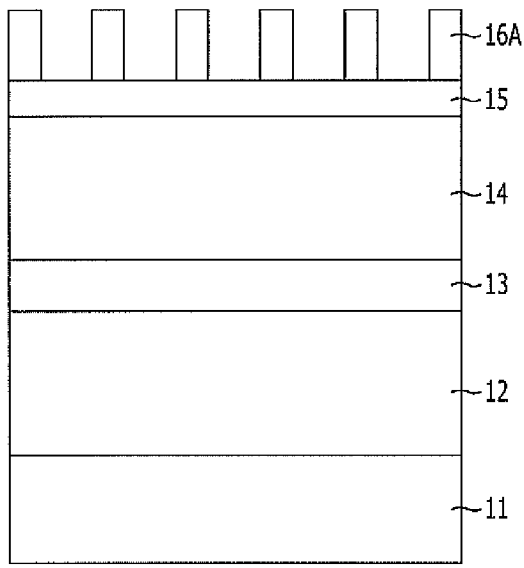

Referring to FIG. 2E, the polysilicon layer 16 is etched using the spacer patterns 21A as an etch barrier to form a polysilicon pattern 16A.

The spacer pattern 21A is removed. When the spacer pattern 21A is formed of oxide, the spacer pattern 21A is removed by wet etching. The wet etching may be performed using a buffered oxide etchant (BOE) or HF solution.

As the spacer pattern 21A having an asymmetrical horn shape is removed, the polysilicon pattern 16A is formed to define a set pattern.

Figure 2F:
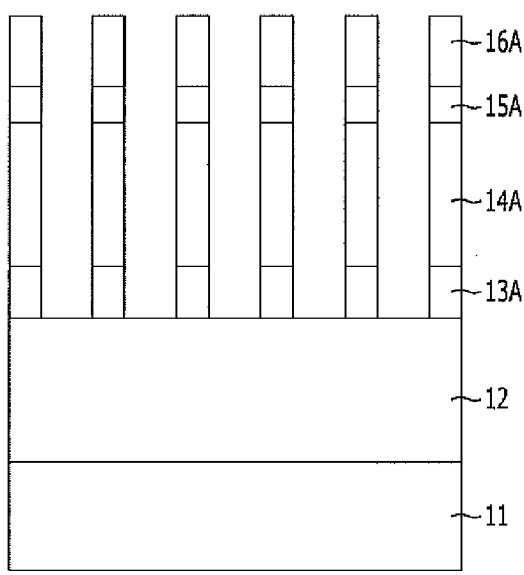

Referring to FIG. 2F, the first silicon oxynitride layer 15, the first carbon layer 14, and the hard mask nitride layer 13 are etched using the polysilicon pattern 16A as an etching barrier.

Accordingly, a hard mask nitride pattern 13A, a first carbon pattern 14A, a first silicon oxynitride pattern 15A, and a polysilicon pattern 16A are formed over the metal layer 12. The polysilicon pattern 16A may be lost by a certain thickness when the lower layers are etched.

The etching process for forming the hard mask nitride pattern 13A, the first carbon pattern 14A, and the first silicon oxynitride pattern 15A may be performed under such a condition as to increase an etching selectivity with respect to the polysilicon pattern 16A. In particular, the etching process is performed in such a manner that the CD of the pattern is further reduced than an expected CD, considering the thickness of a subsequent etching protection layer. For this operation, the etching process is performed by applying a top source of 500 W to 800 W, applying a bias power of 150V to 350V, and using a gas mixture of $Cl_2$ and $N_2$.

For the purpose of description, the hard mask nitride pattern 13A, the first carbon pattern 14A, the first silicon oxynitride pattern 15A, and the polysilicon pattern 16A are collectively referred to as a hard mask pattern.

Figure 2G:
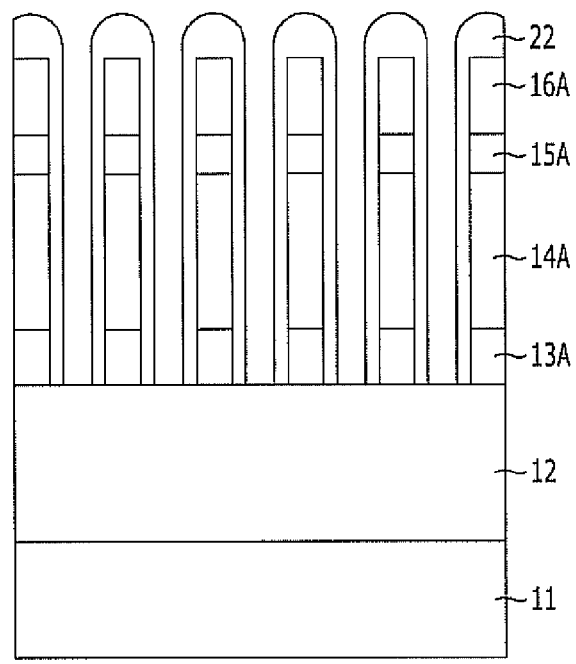

Referring to FIG. 2G, an insulation layer for an etching protection layer 22 is formed along the surface of the entire structure including the hard mask pattern. The etching protection layer 22 serves to increase an etching selectivity between the hard mask pattern and the metal layer 12 and prevent a sidewall loss of the hard mask pattern, thereby preventing the metal layer 12 from being cut.

The etching protection layer 22 is formed at a temperature where the metal layer 12 is not oxidized, and it may be formed of oxide. The oxide includes ULTO, for example. The ULTO is formed at a temperature of 75° C. to 100° C., and it has an excellent step coverage and thickness uniformity, while preventing the oxidation of the metal layer 12. Therefore, the ULTO is formed with a uniform thickness along the surface of the entire structure, without the occurrence of overhang or the like.

The etching protection layer 22 is formed to have such a thickness as not to have an effect upon the etching of the metal layer 12 while preventing a sidewall loss of the hard mask pattern. For example, the etching protection layer 22 may be formed to have a thickness of 30 Å to 50 Å.

The portion of the insulation layer formed on the metal layer 12 is removed to expose the metal layer 12. The process of removing the portion of the insulation layer is performed by applying a top source of 500 W to 800 W, applying a bias power of 200V to 300V, and using a gas mixture of $CF_4$ and $CHF_3$.

The metal layer 12 is etched while protecting the sidewalls of the hard mask pattern. The etching process is divided in a primary etching process and a secondary etching process. The primary etching process will be described with reference to FIG. 2H, and the secondary etching process will be described with reference to FIG. 2I.

Figure 2H:
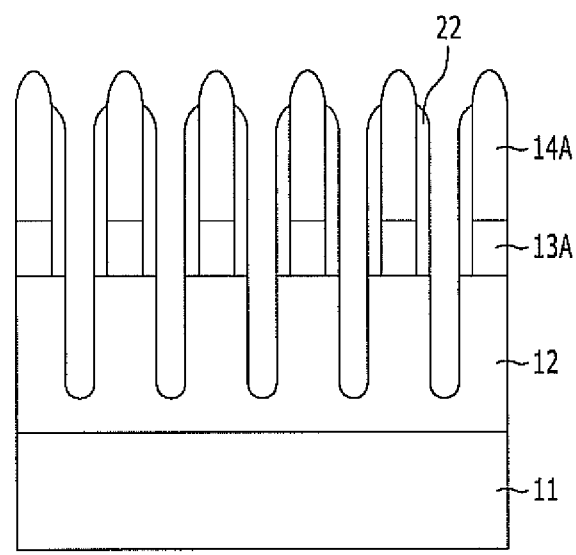

Referring to FIG. 2H, the primary etching process is performed on the metal layer 12 exposed between the etching protection layers 22. The primary etching process is performed through anisotropic etching using a gas mixture of $NF_3$ and $Cl_2$ containing a large amount of F. For the primary etching process, a top source of 500 W to 800 W and a bias power of 100V to 200V may be applied.

During the primary etching process, etching gas containing a large amount of F is used. However, since the sidewalls of the hard mask pattern are protected by the etching protection layer 22, the adequate CD of the pattern may be secured.

While the primary etching process is performed, the polysilicon pattern 16A and the first silicon oxynitride pattern 15A may be removed, and the first carbon pattern 14A and the etching protection layer 22 may be partially etched. However, since the hard mask nitride pattern 13A is protected by the etching protection layer 22 so as not to be lost, during the etching of the metal layer 12, the CD of the metal layer may not be affected by the sidewall loss of the hard mask pattern.

Figure 2I:
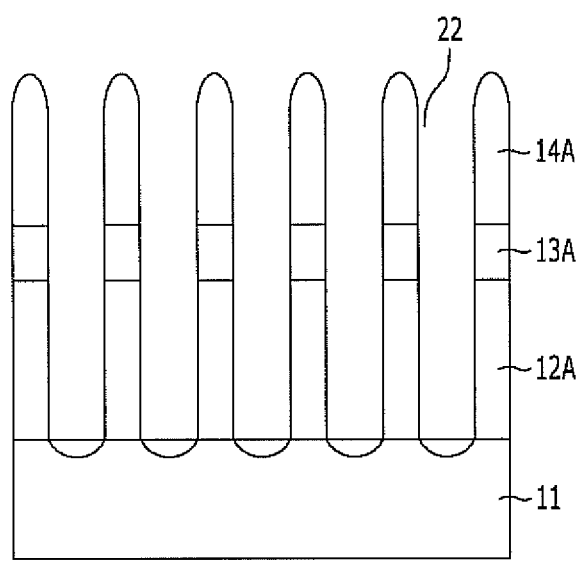

Referring to FIG. 2I, the secondary etching process is performed to form a metal pattern 12A. The secondary etching process is performed to completely etch the metal layer 12 which was not etched during the primary etching process and simultaneously remove the etching protection layer 22 formed on the sidewalls of the hard mask pattern. For this operation, the secondary etching process is performed using a gas mixture of $CF_4$ and $Cl_2$ which may etch W and oxide.

As the CD increased by the etching protection layer 22 is also controlled by the secondary etching process, the metal pattern 12A having fine patterns is formed.

As the etching protection layer 22 is formed to protect the sidewalls of the hard mask pattern and two etching processes are performed to form the metal pattern 12A, while securing the CD of the metal pattern 12A, the metal pattern 12A may be prevented from being less-etched. Therefore, the pattern formation may be reliably performed.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a metal pattern in a semiconductor device, comprising:
   forming a metal layer over a substrate;
   forming a hard mask layer over the metal layer;
   forming a sacrifice pattern over the hard mask layer;
   forming a spacer pattern on sidewalls of the sacrifice pattern;
   then completely removing the sacrifice pattern;
   forming a hard mask pattern by etching the hard mask layer using the spacer pattern as an etch barrier;
   forming an etching protection layer along a surface of the substrate including the hard mask pattern;
   removing the etching protection layer formed on the metal layer to form etching protection patterns; and
   forming the metal pattern by performing primary and secondary etching processes on the metal layer using the etching protection patterns as an etch barrier.

2. The method of claim 1, wherein the hard mask layer comprises a stacked structure of a hard mask nitride layer, a carbon layer, a silicon oxynitride layer, and a polysilicon layer.

3. The method of claim 1, wherein the sacrifice pattern comprises a carbon layer.

4. The method of claim 1, wherein the sacrifice pattern comprises a spin on carbon (SOC) layer or an amorphous carbon layer.

5. The method of claim 1, wherein the removing of the sacrifice pattern is performed by an oxygen stripping process.

6. The method of claim 1, wherein the spacer pattern is formed of a material having an etching selectivity with respect to the sacrifice pattern and the hard mask layer.

7. The method of claim 6, wherein the spacer pattern is formed of oxide.

8. The method of claim 1, wherein the spacer pattern comprises an ultra low temperature oxide (ULTO).

9. The method of claim 1, wherein the etching protection layer comprises an ultra low temperature oxide (ULTO).

10. The method of claim 9, wherein the ULTO is formed at a temperature of 75° C. to 100° C.

11. The method of claim 1, wherein the etching protection layer is formed to have a thickness of 30 Å to 50 Å.

12. The method of claim 1, wherein the primary etching process is performed using a gas mixture of $NF_3$ and $Cl_2$.

13. The method of claim 1, wherein the secondary etching process is performed to etch the metal layer and simultaneously remove the etching protection layer.

14. The method of claim 1, wherein the secondary etching process is performed using a gas mixture of $CF_4$ and $Cl_2$.

15. The method of claim 1, wherein the primary etching process includes etching the exposed metal layer between the etching protection patterns.

16. The method of claim 15, wherein the secondary etching process includes etching the exposed metal layer over the substrate.

17. The method of claim 15, wherein the secondary etching process further comprises:
   removing the etching protection layer formed on the sidewalls of the hard mask pattern.

* * * * *

UNITED STATES PATENT AND TRADEMARK OFFICE
CERTIFICATE OF CORRECTION

PATENT NO. : 8,513,132 B2  
APPLICATION NO. : 13/324419  
DATED : August 20, 2013  
INVENTOR(S) : Mi-Na Ku Page 1 of 1

It is certified that error appears in the above-identified patent and that said Letters Patent is hereby corrected as shown below:

Title Page, item (56), Foreign Patent Documents, first reference should read as follows

-- KR    10-2006-0106329    * 10/2006 --

Signed and Sealed this  
Twenty-fourth Day of September, 2013

Teresa Stanek Rea  
*Deputy Director of the United States Patent and Trademark Office*